United States Patent [19]

Kimura

[11] Patent Number: 5,748,041
[45] Date of Patent: May 5, 1998

[54] AGC AMPLIFIER CIRCUIT USING TRIPLE-TAIL CELL

[75] Inventor: Katsuji Kimura, Tokyo, Japan

[73] Assignee: NEC Corporation, Tokyo, Japan

[21] Appl. No.: 629,199

[22] Filed: Apr. 8, 1996

[30] Foreign Application Priority Data

Jul. 14, 1995 [JP] Japan ................. 7-201680

[51] Int. Cl.$^6$ .......................... H03F 3/45; H03G 3/30
[52] U.S. Cl. ................. 330/254; 330/253; 330/279
[58] Field of Search ................... 330/253, 254, 330/278, 275

[56] References Cited

U.S. PATENT DOCUMENTS

| | | | |
|---|---|---|---|
| 4,293,822 | 10/1981 | McFadyen | 330/254 |
| 4,621,238 | 11/1986 | Fenk | 330/254 |
| 5,481,224 | 1/1996 | Kimura . | |
| 5,485,119 | 1/1996 | Kimura . | |
| 5,500,623 | 3/1996 | Kimura . | |
| 5,512,855 | 4/1996 | Kimura . | |
| 5,521,542 | 5/1996 | Kimura . | |
| 5,561,392 | 10/1996 | Kimura . | |
| 5,578,965 | 11/1996 | Kimura . | |
| 5,581,211 | 12/1996 | Kimura . | |

*Primary Examiner*—James B. Mullins
*Attorney, Agent, or Firm*—Sughrue, Mion, Zinn, Macpeak & Seas, PLLC

[57] ABSTRACT

At AGC amplifier circuit having a triple-tail cell including first, second and, third transistors whose emitter or sources are coupled together. The first and second transistors form a differential transistor-pair. The first, second and third transistors are driven by a single tail current. Bases or gates of the first and second transistors form input ends of the triple-tail cell to be applied with an input signal to be amplified. Collectors or drains of the first and second transistors form output ends of the triple-tail cell from which an amplified output signal with a variable gain is derived. A collector or drain of the third transistor form an output end of the triple-tail cell from which a rectified output signal is derived. A base or gate of the third transistor forms an input end of the first triple-tail cell to be applied with a gain control signal. The gain control signal is produced by using the rectified output signal and is negatively fed back to the differential transistor-pair, thereby making automatic gain control. The triple-tail cell serves as a variable gain cell and a full-wave rectifier.

15 Claims, 11 Drawing Sheets

AGC AMPLIFIER CIRCUIT USING TRIPLE-TAIL CELL

BACKGROUND OF THE INVENTION

1. Field of the Invention

The present invention relates to an automatic gain control (AGC) amplifier circuit and more particularly, to an AGC amplifier circuit formed on a semiconductor integrated circuit device, which is capable of low voltage operation, low current consumption, and wide input dynamic range.

2. Description of the Prior Art

A conventional AGC amplifier is formed by using a four-quadrant multiplier, the four-quadrant operation of which is limited within two quadrants. As the four-quadrant multiplier, for example, the Gilbert multiplier cell has been used.

The conventional AGC amplifier of this type has the following problems:

First, a control-voltage generation circuit for generating a gain-control voltage needs a rectifier circuit.

Second, the control-voltage generation circuit is required to include a circuit for limiting the operation range of the four-quadrant multiplier within two quadrants. As a result, the circuit configuration becomes very complicated, which enlarges the circuit scale and increases the circuit current.

Third, as is the case with the Gilbert multiplier, the four-quadrant multiplier contains vertically stacked transistors. Accordingly, low-voltage operation at a voltage of less than 2 V cannot be realized.

SUMMARY OF THE INVENTION

Accordingly, an object of the present invention is to provide an AGC amplifier circuit that enables reduction the circuit scale and total current consumption.

Another object of the present the invention is to provide an AGC amplifier circuit that is capable of low-voltage operation at a voltage as low as approximately 1.0 V.

The above objects together with others not specifically mentioned will become clear to those skilled in the art from the following description.

An AGC amplifier circuit according to the present invention includes a triple-tail cell including first, second and third transistors whose emitter or sources are coupled together. The first and second transistors form a differential transistor-pair. The first, second and third transistors are driven by a single tail current.

Bases or gates of the first and second transistors form input ends of the triple-tail cell to be applied with an input signal to be amplified. Collectors or drains of the first and second transistors form output ends of the triple-tail cell from which an amplified output signal with a variable gain is derived.

A collector or drain of the third transistor form an output end of the triple-tail cell from which a rectified output signal is derived.

A base or gate of the third transistor forms an input end of the first triple-tail cell to be applied with a gain control signal. The gain control signal is produced by using the rectified output signal and is negatively fed back to the differential transistor-pair, thereby making automatic gain control.

With the AGC amplifier circuit according to the present invention, the triple-tail cell containing the emitter-coupled or source-coupled first, second and third transistors serves as a variable gain cell and a full-wave rectifier. In other words, the variable gain cell and the full-wave rectifier can be replaced with the triple-tail cell.

Therefore, the number of necessary transistors is decreased and as a result, the circuit scale can be reduced. Also, since the number of necessary current sources is decreased, the total current consumption also can be lowered.

Further, because the triple-tail cell contains no stacked transistors, low-voltage operation at a voltage as low as approximately 1.0 V can be realized.

In a preferred embodiment, an operational amplifier whose input ends are respectively connected to the collectors or drains of the first and second transistors is further provided. The operational amplifier amplifies the amplified output signal to produce an output signal of the AGC amplifier circuit.

In another preferred embodiment, an operational amplifier whose output end is connected to the collector or drain of the third transistor and whose input ends are applied with the rectified output signal and a reference signal. The operational amplifier amplifies the difference between the rectified output signal and the reference signal to thereby produce the gain control signal.

In still another preferred embodiment, the AGC amplifier circuit includes first to n-th triple-tail cells cascade connected, where n is an integer equal to or greater than two.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Preferred embodiments of the present invention will be described in detail below with reference to the drawings.

FIRST EMBODIMENT

Figure 1:
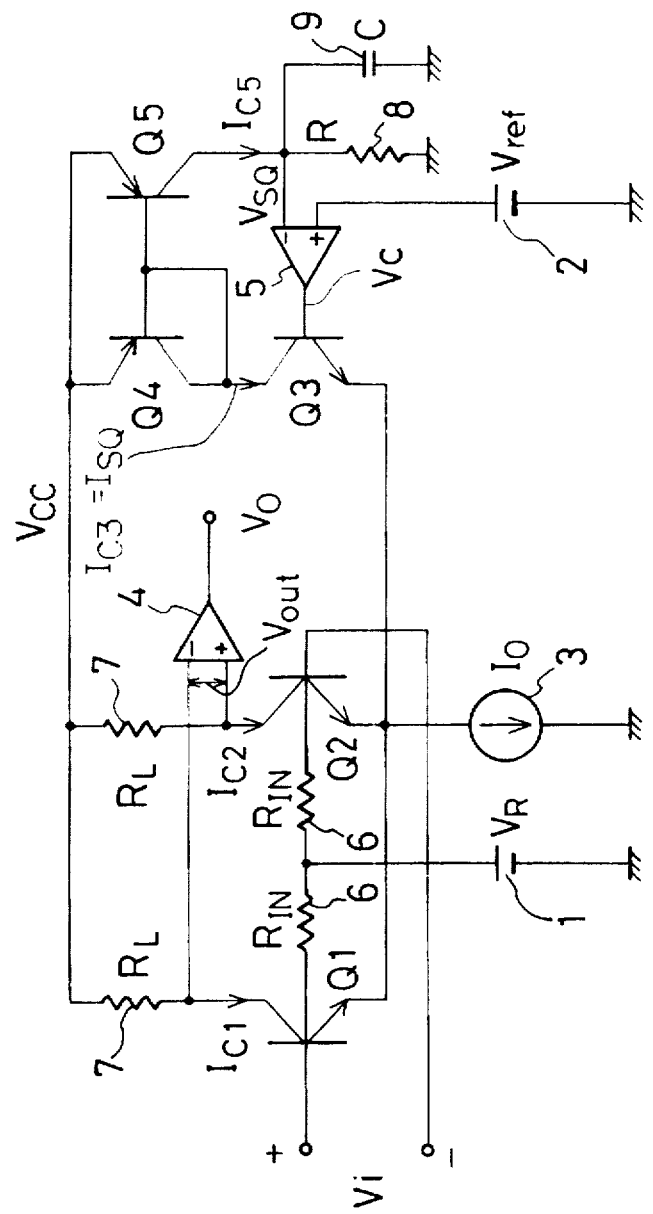
FIG. 1 is a circuit diagram of a bipolar AGC amplifier circuit according to a first embodiment of the present invention.

An AGC amplifier circuit according to a first embodiment of the present invention is shown in FIG. 1.

As shown in FIG. 1, this AGC amplifier circuit has a triple-tail cell including three npn-type bipolar transistors Q1, Q2 and Q3. The transistors Q1 and Q2 form a differential transistor-pair.

The emitter areas of the transistors Q1 and Q2 are equal to each other and therefore, this differential pair is of a balanced type. The emitter area of transistor Q3 is K times that of the transistors Q1 and Q2, where K is a constant equal to or greater than unity (i.e., $K \geq 1$). The transistors Q1 and Q2 are made of minimum-sized unit transistors.

Emitters of the transistors Q1, Q2 and Q3 are coupled together to be connected to one end of a constant current source 3 supplying a constant current $I_o$. The other end of the source 3 is grounded. The transistors Q1, Q2 and Q3 forming the triple-tail cell are driven by this single tail current $I_o$.

Bases of the transistors Q1 and Q2 form input ends of the triple-tail cell to be applied with an input voltage $V_i$ to be amplified. Collectors of the transistors Q1 and Q2 form output ends of the triple-tail cell from which an amplified output voltage $V_{out}$ with a variable gain is derived.

Two resistors 6 with the same resistance value of $R_{IN}$ are connected between the bases of the transistors Q1 and Q2. A dc reference voltage source 1 supplying a dc reference voltage $V_R$ is connected between the connection point of the resistors 6 and the ground.

Two load resistors 7 with the same resistance value of $R_L$ are connected to the collectors of the transistors Q1 and Q2, respectively. The amplified output voltage $V_{out}$ is produced by these resistors 7.

The amplified output voltage $V_{out}$ is supplied to an operational amplifier 4. The voltage $V_{out}$ is amplified by the amplifier 4 and is differentially outputted as an output voltage $V_o$ of the AGC amplifier circuit.

A collector of the transistor Q3 form an output end of the triple-tail cell from which a rectified output current $I_{SQ}$ is derived. A base of the transistor Q3 forms an input end of the first triple-tail cell to be applied with a gain control voltage $V_c$.

The gain control voltage $V_c$ is produced by an operational amplifier 5 using the rectified output current $I_{SQ}$ ($=I_{c3}$). Specifically, two npn-type bipolar transistors Q4 and Q5, which forms a current mirror circuit, are provided. Further, a voltage source 2 supplying a dc reference voltage $V_{ref}$ to one input end of the amplifier 5, and a smoothing resistor 8 with a resistance R and a smoothing capacitor 9 with a capacitance C.

The transistors Q4 and Q5 constitutes a current output circuit for outputting a current ($=IC_5$) with the same current value as that of the rectified output current $I_{SQ}$. The combination of the resistor 8 and capacitor 9 smooths the rectified current thus outputted and produces a rectified voltage $V_{SQ}$ to supply it to the other input end of the amplifier 5.

The operational amplifier 5 produces the gain control voltage $V_c$ dependent upon the difference between the applied voltages $V_{SQ}$ and $V_{ref}$ thereby increasing the gain of the negative feed-back loop. The gain control voltage $V_c$ is applied to the base of the transistor Q3 and is negatively fed back to the differential pair of the transistors Q1 and Q2, thereby realizing an automatic gain control function. In FIG. 1, the reference character $V_{cc}$ indicates a supply voltage.

Next, the operation of the AGC amplifier circuit according to the first embodiment is explained below.

Ignoring the base-width modulation of the bipolar transistors, collector currents $I_{ci}$ (i=1 to 3) of the bipolar transistors Q1, Q2 and Q3 are expressed by the following equations (1), (2) and (3), respectively.

$$I_{C1} = I_S \exp\left( \frac{V_R + \frac{1}{2}V_i - V_S}{V_T} \right) \quad (1)$$

$$I_{C2} = I_S \exp\left( \frac{V_R - \frac{1}{2}V_i - V_S}{V_T} \right) \quad (2)$$

$$I_{C3} = KI_S \exp\left( \frac{V_R + V_C - V_S}{V_T} \right) \quad (3)$$

In the equations (1), (2) and (3), $V_T$ is the thermal voltage of the transistors Q1 to Q3 defined as $V_T = kT/q$ where k is the Boltzmann's constant, T is absolute temperature in degrees Kelvin, and q is the charge of an electron. Also, $I_s$ is the saturation current, $\pm V_i/2$ is the differential input voltage into the differential pair of the transistors Q1 and Q2, and $V_s$ is a common emitter voltage of the transistor Q1, Q2 and Q3.

The tail current $I_o$ satisfies the following equation (4), where $\alpha_F$ is the dc common-base current gain factor.

Solving the equations (1) to (4) provides the common term: $I_s \exp\{(V_R - V_S)/V_T\}$ as the following equation (5):

$$I_S \exp\left( \frac{V_R - V_S}{V_T} \right) = \frac{\alpha_F I_0}{2\cosh\left( \frac{V_i}{2V_T} \right) + K\exp\left( \frac{V_C}{V_T} \right)} \quad (5)$$

By using the equation (5), the respective collector currents $I_{c1}$, $I_{c2}$ and $I_{c3}$ can be expressed by the following equations (6), (7) and (8), respectively.

$$I_{C1} = \frac{\alpha_F I_0 \exp\left( \frac{V_i}{2V_T} \right)}{2\cosh\left( \frac{V_i}{2V_T} \right) + K\exp\left( \frac{V_C}{V_T} \right)} \quad (6)$$

$$I_{C2} = \frac{\alpha_F I_0 \exp\left( -\frac{V_i}{2V_T} \right)}{2\cosh\left( \frac{V_i}{2V_T} \right) + K\exp\left( \frac{V_C}{V_T} \right)} \quad (7)$$

$$I_{C3} = \frac{K\alpha_F I_0 \exp\left( \frac{V_C}{V_T} \right)}{2\cosh\left( \frac{V_i}{2V_T} \right) + K\exp\left( \frac{V_C}{V_T} \right)} \quad (8)$$

Figure 2:
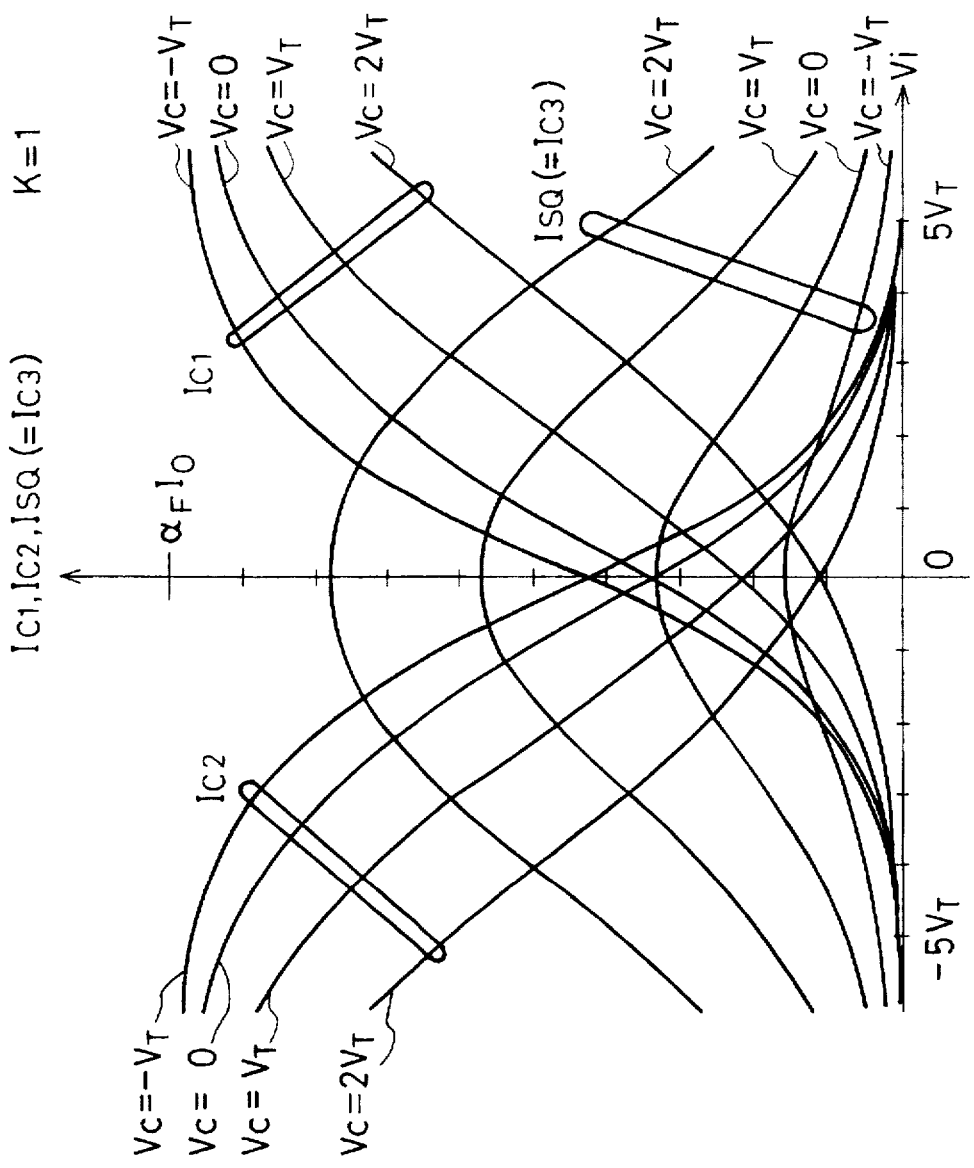
FIG. 2 is a graph showing the collector current and rectified output current characteristics of the AGC amplifier circuit according to the first embodiment with respect to the input voltage $V_i$.

FIG. 2 shows the collector current characteristics of the respective transistors in the bipolar triple-tail cell when K=1 (i.e., the transistors Q1, Q2 and Q3 are all unit transistors).

A differential output current $\Delta I_c$ of the bipolar triple-tail cell can be expressed by the following equation (9):

$$\Delta I_C = I_{C1} - I_{C2} \quad (9)$$

$$= \frac{2\alpha_F I_0 \sinh\left(\frac{V_i}{2V_T}\right)}{2\cosh\left(\frac{V_i}{2V_T}\right) + K\exp\left(\frac{V_C}{V_T}\right)}$$

Figure 3:
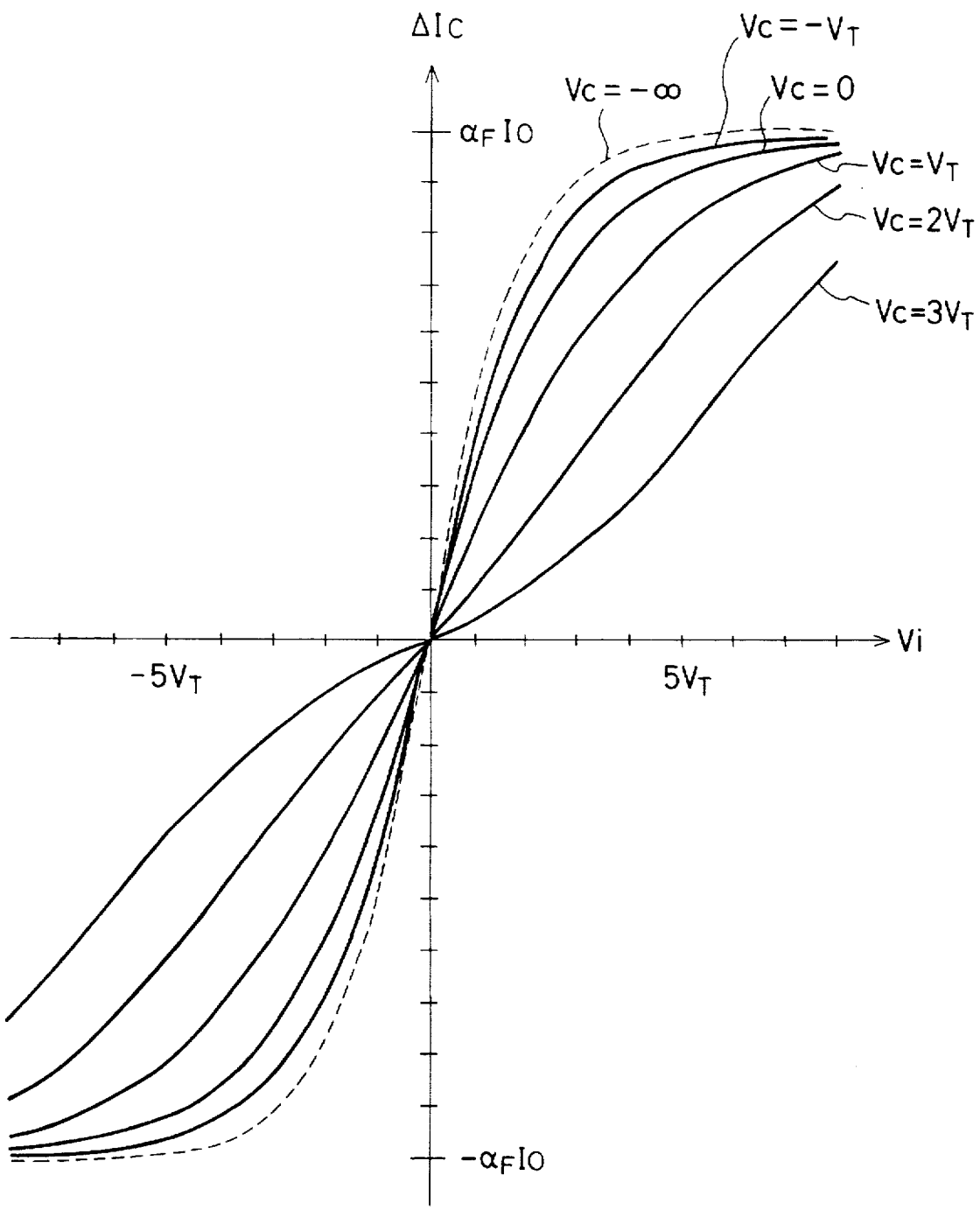
FIG. 3 is a graph showing the differential output current (transfer) characteristics of the AGC amplifier according to the first embodiment with respect to the input voltage $V_i$.

FIG. 3 shows the differential output current characteristic of the bipolar triple-tail cell.

By differentiating the equation (9) for $v_i$, the transconductance characteristic of the bipolar triple-tail cell is expressed as the following equation (10):

$$\frac{d(\Delta I_C)}{dV_i} = \frac{\alpha_F I_0}{V_T} \frac{K\exp\left(\frac{V_C}{V_T}\right)\cosh\left(\frac{V_i}{2V_T}\right) + 2}{\left\{2\cosh\left(\frac{V_i}{2V_T}\right) + K\exp\left(\frac{V_C}{V_T}\right)\right\}^2} \quad (10)$$

Figure 4:
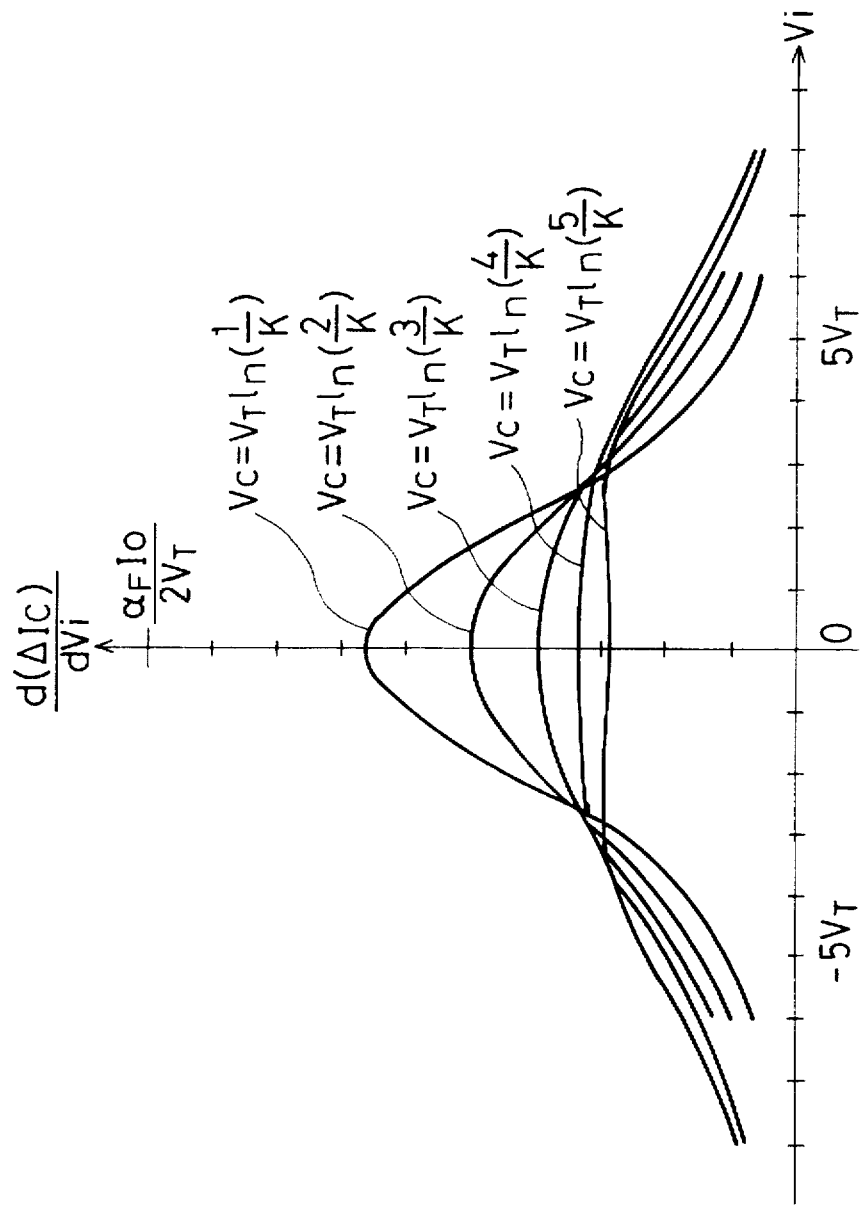
FIG. 4 is a graph showing the transconductance characteristics of AGC amplifier circuit according to the first embodiment with respect to the input voltage $V_i$

FIG. 4 shows the transconductance characteristic of the bipolar triple-tail cell.

The short-circuit transconductance for small signal applications can be expressed by the following equation (11) as $$\left.\frac{d(\Delta I_C)}{dV_i}\right|_{V_i=0} = \frac{\alpha_F I_0}{V_T} \frac{1}{2 + K\exp\left(\frac{V_C}{V_T}\right)} \quad (11)$$

Figure 5:
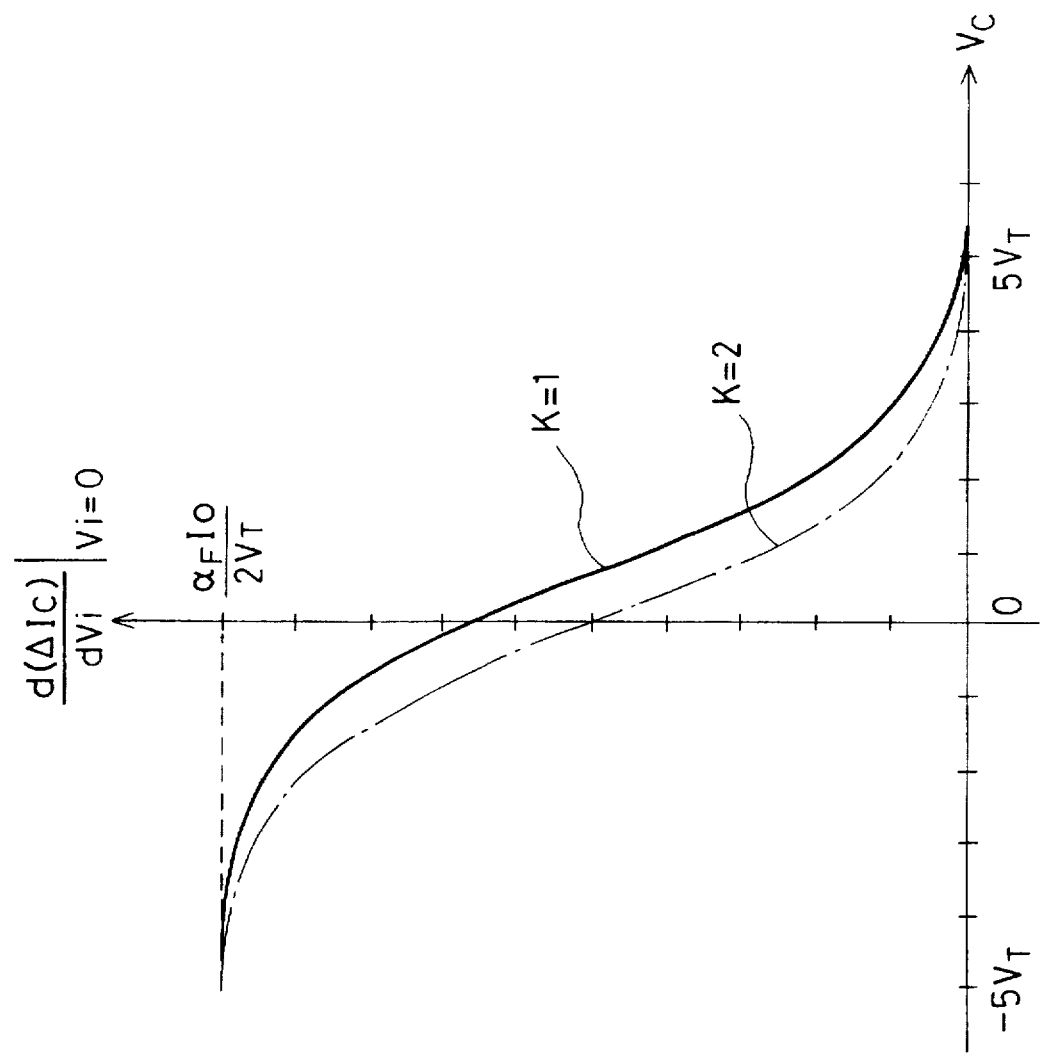
FIG. 5 is a graph showing the short-circuit transconductance characteristics of AGC amplifier circuit according to the first embodiment with respect to the control voltage $V_c$.

FIG. 5 shows the short-circuit transconductance characteristic of the bipolar triple-tail cell.

It is seen from FIGS. 3 and 4 that the differential output current $\Delta I_c$ of the bipolar triple-tail cell can be varied with the control voltage $V_c$ to vary the transconductance. The transconductance for small signal applications is provided by the short-circuit transconductance characteristic as shown in FIG. 5.

The differential output current $\Delta I_c$ of the bipolar triple-tail cell produces the amplified output voltage $V_o$ as an output of this AGC amplifier circuit through the load resistors 7, which means that a voltage gain with respect to the input voltage $V_i$ can be obtained. Here, it is seen from FIGS. 3 and 4 that the voltage gain for small signal applications can be varied from a maximum of $(\alpha_F I_0 R_L/V_T)$ to a minimum of 0 by varying the control voltage $V_c$.

The rectified current $I_{SQ}$ of the bipolar triple-tail cell can be expressed by the following equation (12):

$$I_{SQ} = I_{C3} \quad (12)$$

It is seen from FIG. 2 that the rectified output current $I_{SQ}$ has a full-wave rectification characteristic, and that the rectification characteristic can be varied with the control current $V_c$. In other words, it is seen that the input voltage range where the square-law characteristic is approximately applicable can be varied with the control voltage $V_c$.

When the operating input voltage range for the bipolar triple-tail cell is 50 mV$_{O-F}$, an obtainable gain width for the differential transistor-pair (i.e., differential amplifier) is slightly less than 20 dB. In this case, it is seen from FIG. 2 that the rectified output current $I_{SQ}$ (=$I_{C3}$) increases monotonously with the increasing control voltage $V_c$, while it decreases monotonously with the increasing input voltage $V_i$.

In the AGC amplifier circuit of the first embodiment of FIG. 1, the rectified output current $I_{SQ}$ is smoothed with a low-pass filter (LPF) made of the resistor 8 and the capacitor 9 to be converted into a rectified voltage $V_{SQ}$. Then, the rectified voltage $V_{SQ}$ is amplified to the desired level of the control voltage $V_c$ in the operational amplifier 5, resulting in the gain control voltage $V_c$ to be applied to the base of the transistor Q3. Thus, the negative feedback loop can be formed by the current mirror circuit made of the transistors Q4 and Q5, the LPF made of the resistor 8 and capacitor 9, and the operational amplifier 5.

With the AGC amplifier circuit according to the first embodiment, the triple-tail cell containing the emitter-coupled transistors Q1, Q2 and Q3 serves as a variable gain cell and a full-wave rectifier and therefore, the variable gain cell and the full-wave rectifier can be replaced with the triple-tail cell. Accordingly, the number of necessary transistors is decreased and as a result, the circuit scale can be reduced. Also, since the number of necessary current sources is only one, the total current consumption also can be lowered.

Especially, in this embodiment, since at least two of the transistors Q1, Q2 and Q3 may be formed by unit transistors, these effects are enhanced.

Further, because the triple-tail cell contains no stacked transistors, low-voltage operation at a voltage as low as approximately 1.0 V can be realized.

SECOND EMBODIMENT

Figure 6:
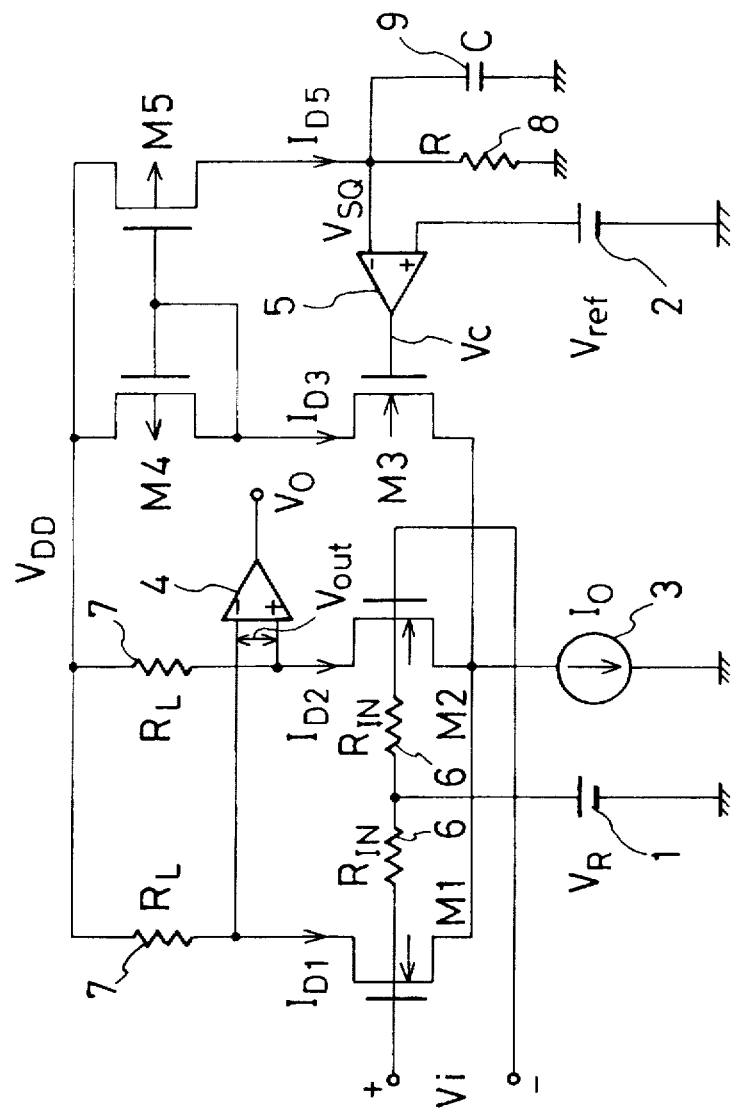
FIG. 6 is a circuit diagram of an MOS AGC amplifier circuit according to a second embodiment of the present invention.

FIG. 6 shows an AGC amplifier circuit according to a second embodiment of the invention, which has a configuration obtained by replacing the bipolar transistors Q1, Q2, Q3, Q4 and Q5 in FIG. 1 with n-channel MOS transistors M1, M2, M3, M4 and M5, respectively. Therefore, the detailed explanation is omitted here for the sake of simplification by attaching the same reference numerals or characters to the corresponding elements.

The MOS transistors M1 and M2 have the same ratio (W/L) of a gate-width W to a gate-length L. The MOS transistor M3 has a ratio (W/L) of K times as large as those of the transistors M1 and M2.

Assuming that the transistors M1, M2 and M3 are matched in characteristic and are operating in the saturation region, and that they have the square-law characteristics, respectively, and ignoring the body-effect, drain currents $I_{D1}$, $I_{D2}$ and $I_{D3}$ of the respective transistors M1, M2 and M3 can be expressed as the following equations (13), (14) and (15), respectively.

$$I_{D1} = \beta(V_R + \tfrac{1}{2}V_1 - V_S - V_{TH})^2 \quad (13)$$

$$I_{D2} = \beta(V_R - \tfrac{1}{2}V_1 - V_S - V_{TH})^2 \quad (14)$$

$$I_{D3} = K\beta(V_R + V_C - V_S - V_{TH})^2 \quad (15)$$

In the equations (13), (14) and (15), $\beta$ is the transconductance parameter of these MOS transistors. $\beta$ is expressed as $\mu(C_{ox}/2)$ (W/L) where $\mu$ is the effective carrier mobility, $C_{ox}$ is the gate oxide capacitance per unit area, and W and L are a gate-width and a gate-length of these transistors, respectively. Also, $V_{TH}$ is the threshold voltage of the transistors M1, M2 and M3.

A tail current of the cell is expressed as the following equation (16).

$$I_{D1} + I_{D2} + I_{D3} = I_0 \quad (16)$$

Solving the equations (13), (14), (15) and (16) provides one of the output current LID Of the triple-tail cell of FIG. 6 as the following equations (17a), (17b) and (17c) as $$\Delta I_D = I_{D1} - I_{D2} \quad (17a)$$

$$= 2\beta V_i \left\{ -\frac{KV_C}{K+2} + \frac{1}{K+2} \sqrt{\frac{(K+2)I_0}{\beta} - \frac{K+2}{2} V_i^2 - 2KV_C^2} \right\} + \frac{2I_0}{K+2}$$

$$\left( |V_i| \leq \sqrt{\frac{2I_0}{\beta} - 4V_C^2} \ , \ |V_i| \leq \frac{-2KV_C + \sqrt{\frac{(K+4)I_0}{\beta} - 4KV_C^2}}{K+4} \right)$$

$$\Delta I_D = I_{D1} - I_{D2} \quad (17b)$$

$$= \frac{2}{K+1} I_0 - \frac{K(K-1)\beta (|V_i| - 2V_C)^2}{(K+2)^2} +$$

$$\frac{K\beta(|V_i| - 2V_C)}{2(K+2)^2} \sqrt{\frac{(K+2)I_0}{\beta} - K(|V_i| - 2V_C)^2}$$

$$\left( \min \left\{ \sqrt{\frac{2I_0}{\beta} - 4V_C^2} \ , \right. \right.$$

$$\left. \left. \frac{-2KV_C + \sqrt{\frac{(K+4)I_0}{\beta} - 4KV_C^2}}{K+4} \right\} \leq |V_i| \leq 2\sqrt{\frac{I_0}{\beta}} \right)$$

$$\Delta I_D = I_{D1} - I_{D2} \quad (17c)$$

$$= I_0 \mathrm{sgn}(V_i) \left( 2\sqrt{\frac{I_0}{\beta}} \leq |V_i| \right)$$

Figure 7:
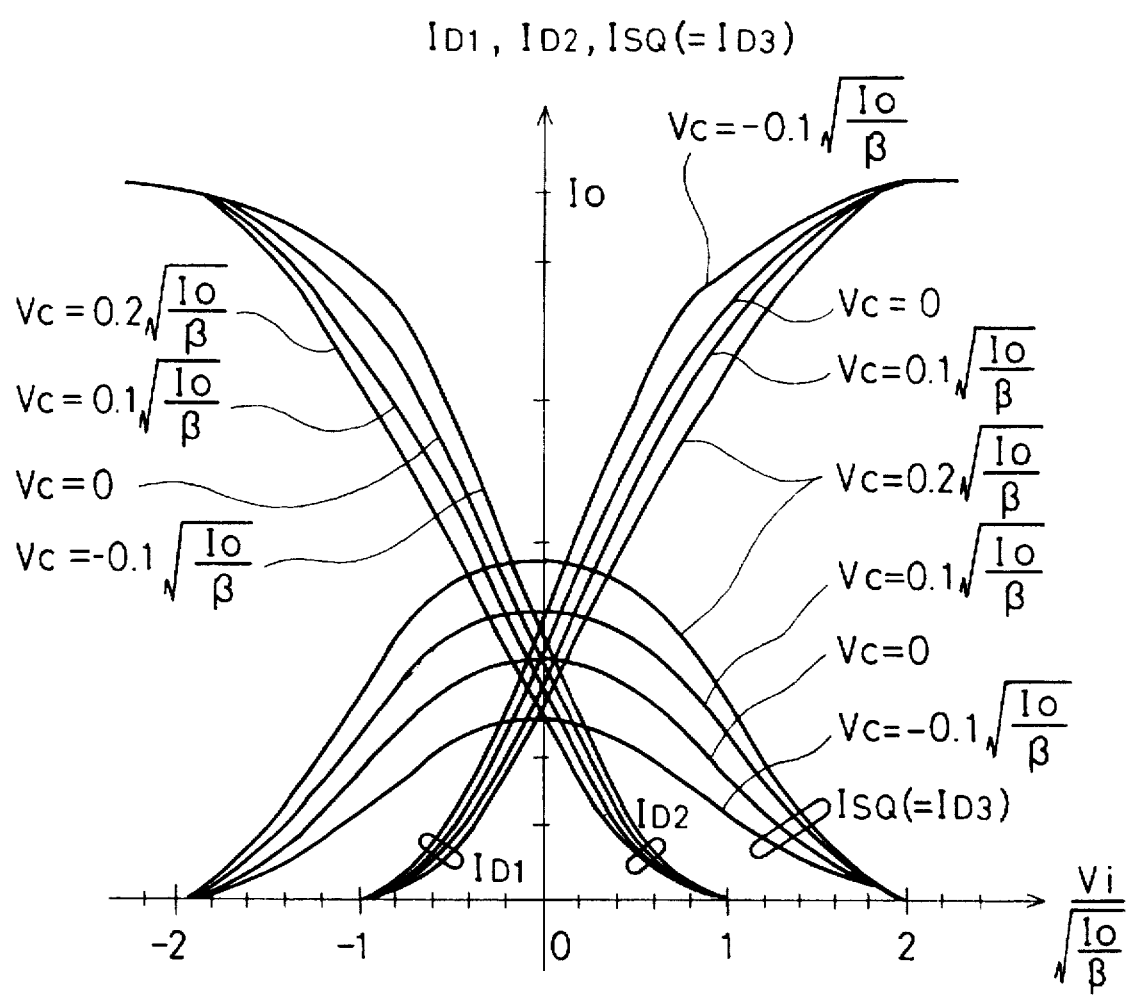
FIG. 7 is a graph showing the collector current and rectified output current characteristics of the AGC amplifier circuit according to the second embodiment with respect to the normalized input voltage $V_i$.

FIG. 7 shows the drain current and rectified output current characteristics of the triple-tail cell of FIG. 6 with respect to the input voltage $V_i$, where K=1 and the input voltage $V_i$ is expressed after normalization by $(I_0/\beta)^{1/2}$.

The differential output current $\Delta I_D$ of the MOS triple-tail cell of FIG. 6 is given by the following equations (18a), (18b) and (18c) as The short-circuit transconductance characteristic of the MOS cell for small signal applications is obtained by differentiating the equation (18a), (18b) and (18c) with the input voltage $V_i$ as $$\frac{d(\Delta I_D)}{dV_i} = 2\beta \left\{ -\frac{KV_C}{K+2} + \frac{1}{K+2} \sqrt{\frac{(K+2)I_0}{\beta} - \frac{K+2}{2} V_i^2 - 2KV_C^2} \right\} - \quad (18a)$$

$$\frac{V_i^2}{\sqrt{\frac{(K+2)I_0}{\beta} - \frac{K+2}{2} V_i^2 - 2KV_C^2}}$$

$$\left( |V_i| \leq \sqrt{\frac{2I_0}{\beta} - 4V_C^2} \ , \ |V_i| \leq \frac{-2KV_C + \sqrt{\frac{(K+4)I_0}{\beta} - 4KV_C^2}}{K+4} \right)$$

$$\frac{d(\Delta I_D)}{dV_i} = -\frac{2K(K-1)\beta(|V_i| - 2V_C)|V_i| - 2V_C|}{(K+2)^2} + \quad (18b)$$

$$\frac{K\beta \mathrm{sgn}(V_i)}{2(K+2)^2} \sqrt{\frac{(K+2)I_0}{\beta} - K(|V_i| - 2V_C)^2} -$$

$$\frac{K^2\beta(|V_i| - 2V_C)^2}{2(K+2)^2 \sqrt{\frac{(K+2)I_0}{\beta} - K(|V_i| - 2V_C)^2}}$$

$$\left( \min \left\{ \sqrt{\frac{2I_0}{\beta} - 4V_C^2} \ , \ \frac{-2KV_C + \sqrt{\frac{(K+4)I_0}{\beta} - 4KV_C^2}}{K+4} \right\} \leq |V_i| \leq 2\sqrt{\frac{I_0}{\beta}} \right)$$

$$\frac{d(\Delta I_D)}{dV_i} = 0 \quad \left( 2\sqrt{\frac{I_0}{\beta}} \leq |V_i| \right) \quad (18c)$$

Figure 8:
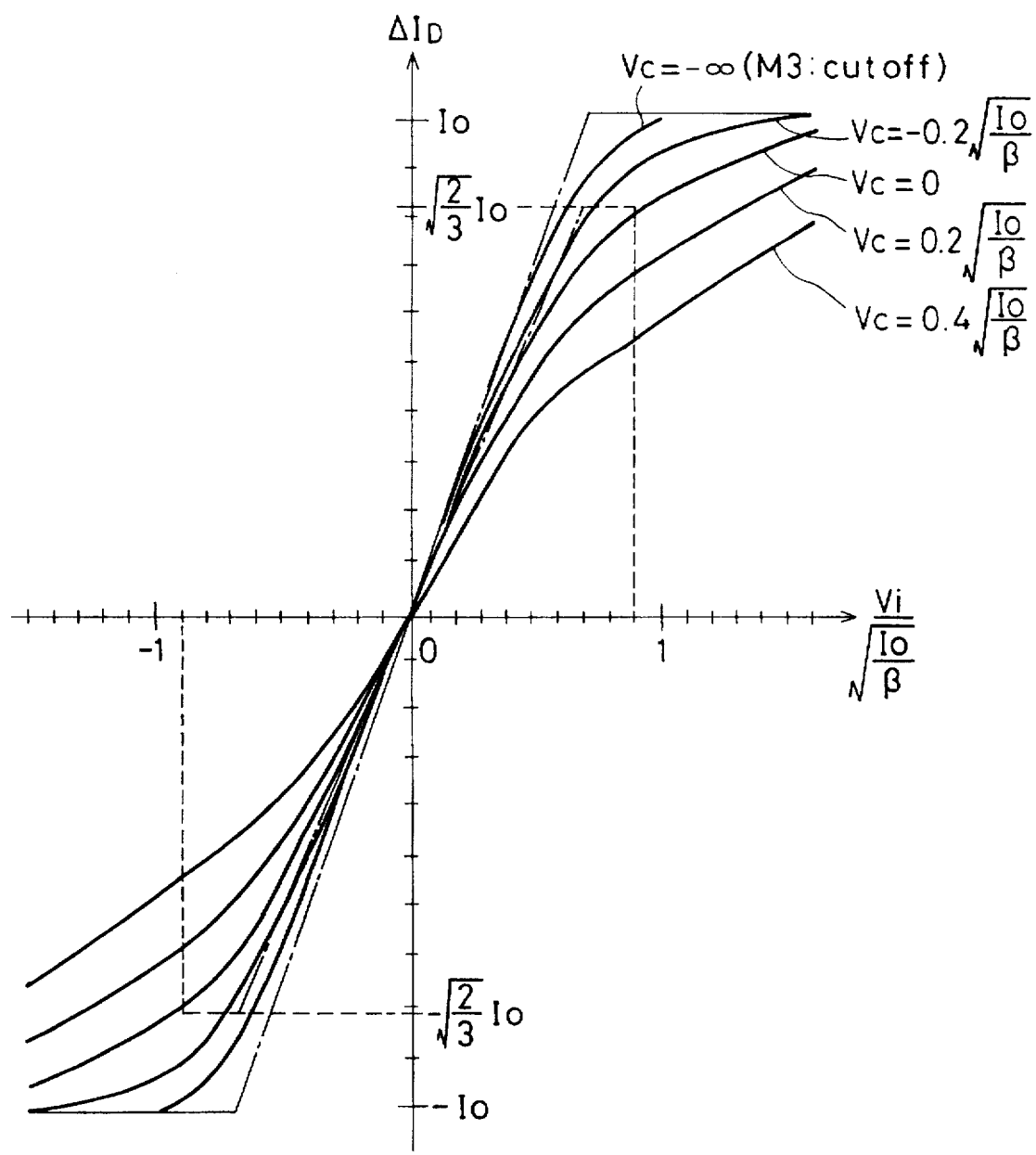
FIG. 8 is a graph showing the differential output current (transfer) characteristics of the AGC amplifier circuit according to the second embodiment with respect to the normalized input voltage $V_i$.

FIG. 8 shows the differential output current characteristics of the MOS triple-tail cell of FIG. 6 with respect to the input voltage $V_i$.

$$\frac{d(\Delta I_D)}{dV_i} \bigg|_{V_i=0} = \quad (19)$$

-continued $$2\beta \left\{ -\frac{KV_C}{K+2} + \frac{1}{K+2} \sqrt{\frac{(K+2)I_0}{\beta} - 2KV_C^2} \right\}$$

Figure 9:
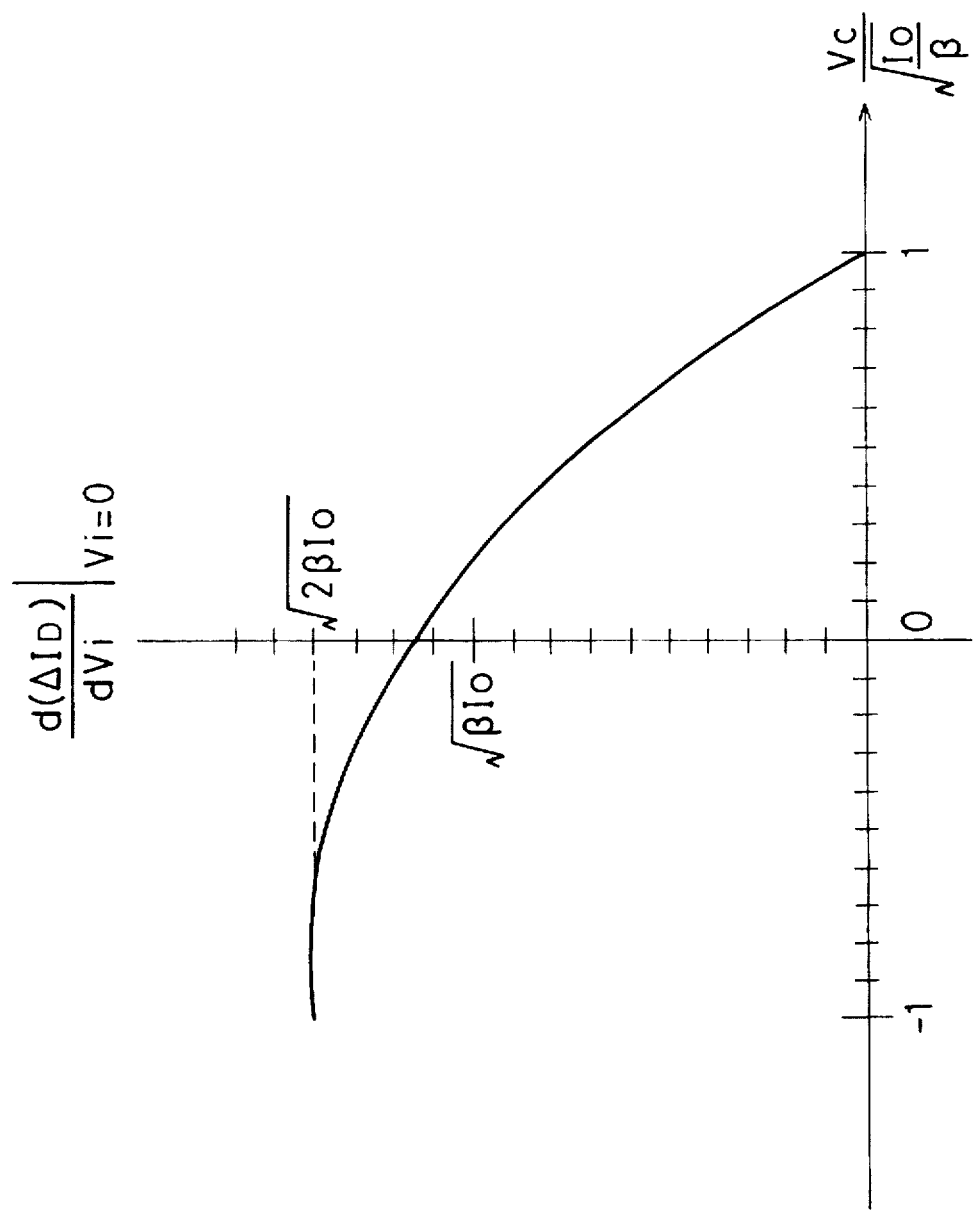
FIG. 9 is a graph showing the short-circuit transconductance characteristics of AGC amplifier circuit according to the second embodiment with respect to the normalized control voltage $V_c$.

FIG. 9 shows the short-circuit transfer characteristics of the MOS triple-tail cell of FIG. 6 with respect to the input voltage $V_i$, where K=1.

It is seen from FIGS. 7 and 8 that the differential output current $\Delta I_D$ varies dependent upon the dc control voltage $V_c$ and as a result, the short-circuit transconductance can be varied with the voltage $V_c$.

With this MOS triple-tail cell, as is the case with the bipolar triple-tail cell, a voltage gain can be obtained. The voltage gain for small signal applications can be varied from a maximum of $\{(2\beta Io)R_L\}^{1/2}$ to a minimum of 0 by varying the DC control voltage $V_c$.

The obtainable voltage gain for the small signal applications can be varied from the maximum value of $(\alpha_F I_o R_L/V_T)$ to the minimum value of 0 by changing the value of the control voltage $V_c$.

The rectified output current $I_{SQ}$ of the cell is expressed by the following equations (20a), (20b) and (20c) as $$I_{SQ} = I_{D3} \tag{20a}$$

$$= -\beta \left[ \frac{KV_i^2}{2(K+2)} + \frac{2K(K-2)}{(K+2)^2} V_C^2 + \right.$$

$$\left. \frac{4KV_C}{(K+2)^2} \sqrt{\frac{(K+2)I_0}{\beta} - \frac{(K+2)}{2} V_i^2 - 2KV_C^2} \right] + \frac{KI_0}{K+2}$$

$$\left( |V_i| \leq \sqrt{\frac{2I_0}{\beta} - 4V_C^2} \ , |V_i| \leq \frac{-2KV_C + 2\sqrt{\frac{(K+4)I_0}{\beta} - 4KV_C^2}}{K+4} \right)$$

$$I_{SQ} = I_{D3} \tag{20b}$$

$$= -\frac{K\beta(|V_i| - V_C)}{2(K+2)^2} \sqrt{\frac{(K+2)I_0}{\beta} - K(|V_i| - 2V_C)^2} + \frac{K-1}{2(K+1)} I_0 -$$

$$\frac{\beta K(K-1)(|V_i| - 2V_C)^2}{(K+2)^2}$$

$$\left( \min \left\{ \sqrt{\frac{2I_0}{\beta} - 4V_C^2} \ , \frac{-2KV_C + \sqrt{\frac{(K+4)I_0}{\beta} - 4KV_C^2}}{K+4} \right\} \leq |V_i| \leq 2\sqrt{\frac{I_0}{\beta}} \right)$$

$$I_{SQ} = I_{D3} = 0 \quad \left( 2\sqrt{\frac{I_0}{\beta}} \leq |V_i| \right) \tag{20c}$$

Similar to the first embodiment, it is seen from FIG. 7 that the current $I_{SQ}$ (=$I_{C3}$) has a full-wave rectification characteristic and is variable by the control voltage $V_c$. Therefore, the temperature dependency of the current $I_{SQ}$ can be cancelled by changing the dc control voltage $V_c$.

It is also seen that the input voltage range enabling the ideal square-law characteristic is given within the following input voltage range as $$|V_i| \leq \min \left\{ \sqrt{\frac{2I_0}{\beta} - 4V_C^2} \ , \frac{-2KV_C + \sqrt{\frac{(K+4)I_0}{\beta} - 4KV_C^2}}{K+4} \right\}$$

Unlike the bipolar amplifier circuit of the first embodiment, the square-law characteristic does not vary dependent upon the voltage $V_c$ because the coefficient of the square term : [K/{(2(K+2))}] in the equation (20a) is a constant. As a result, the output current $I_{SQ}$ of the MOS triple-tail cell has a full-wave rectification characteristic, and the rectification characteristic can be varied with the control voltage $V_c$.

Assuming that the operating input voltage range for the MOS triple-tail cell is $0.4(I_o/\beta)^{1/2}V_{O-P}$, an obtainable gain change width (i.e., input dynamic range) for the differential amplifier is ten and several decibels.

In this case, the rectified output current $I_{SQ}$ increases monotonously with the increasing control voltage $V_c$, while it monotonously decreases with the increasing input voltage $V_i$. Therefore, because of the same reason as that of the first embodiment, a negative feedback loop for the AGC amplifier can be formed.

As described above, in this second embodiment, the same advantage as those in the first embodiment can be obtained.

THIRD EMBODIMENT

Figure 10:
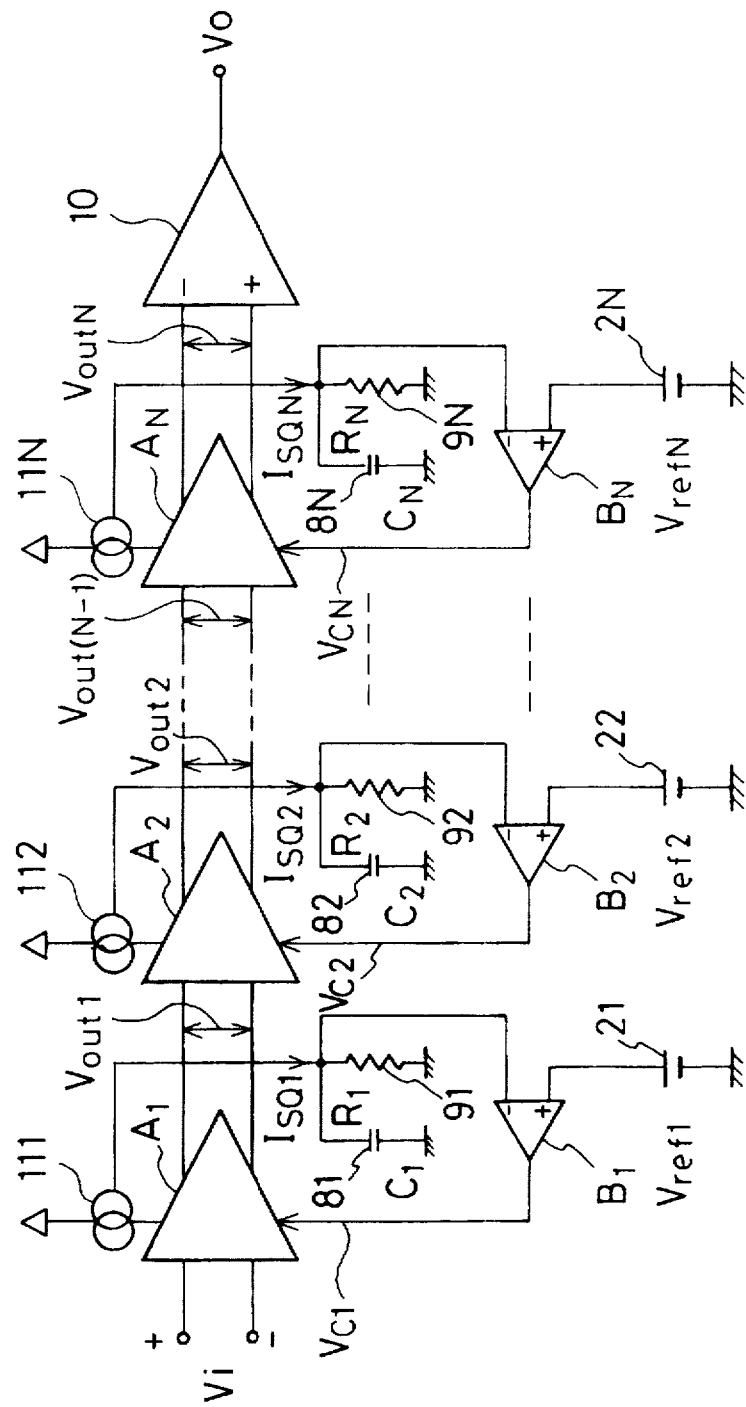
FIG. 10 is a circuit diagram of an AGC amplifier circuit according to a third embodiment of the present invention, which includes a plurality of triple-tail cells are cascade connected.

FIG. 10 shows an AGC amplifier circuit according to a third embodiment of the present invention.

As shown in FIG. 10, this AGC amplifier circuit has first to N-th AGC amplifier subcircuits $A_1$ to $A_N$ cascade connected, where N is an integer greater than or equal to two, and an output amplifier 10 connected to the N-th subcircuit $A_N$. The output voltage $V_o$ is taken out from the output amplifier 10.

In FIG. 10, for the sake of convenience of explanation, such components as operational amplifiers $B_1, B_2, \ldots, B_N$ for increasing the loop gain, which are originally to be included in the AGC amplifier subcircuits $A_1$ to $A_N$, are shown outside the corresponding subcircuits.

The reference numerals 21, 22 . . . . and 2N indicate voltage sources for supplying reference voltages $V_{ref1}, V_{ref2}, \ldots, V_{refN}$. 81, 82, . . . , 8N indicate capacitors (capacitance: C1 to CN) each functioning as a part of a low-pass filter, 91, 92, ....., 9N indicate resistors (resistance: R1 to RN) each functioning as another part of the low-pass filter, and 111, 112, 11N indicate current mirror circuits each functioning as a current output circuit, respectively. The reference characters $V_{C1}, V_{C2}, \ldots, V_{CN}$ indicated gain control voltages, the reference characters $I_{SQ1}, I_{SQ2}, \ldots, I_{SQN}$ indicate rectified output currents, and $V_{out1}, V_{out2}, \ldots, V_{out(N-1)}$ and $V_{outN}$ indicate amplified output voltages of the AGC amplifier subcircuits $A_1$ to $A_N$, respectively.

In this N-stage AGC amplifier, each of the subcircuits $A_1$ to $A_N$ has the, same configuration, and operates to produce a fixed output under the control of a corresponding one of the gain control voltages $V_{C1}$ to $V_{CN}$. Thus, the N-th AGC amplifier subcircuit N at the last stage also produces a fixed output.

Thus, since the circuit configuration of each subcircuit $A_1$, $A_2, \ldots,$ or $A_N$ containing its negative feedback loop is extremely simple, this multi-stage AGC amplifier circuit can be easily realized.

FOURTH EMBODIMENT

Figure 11:
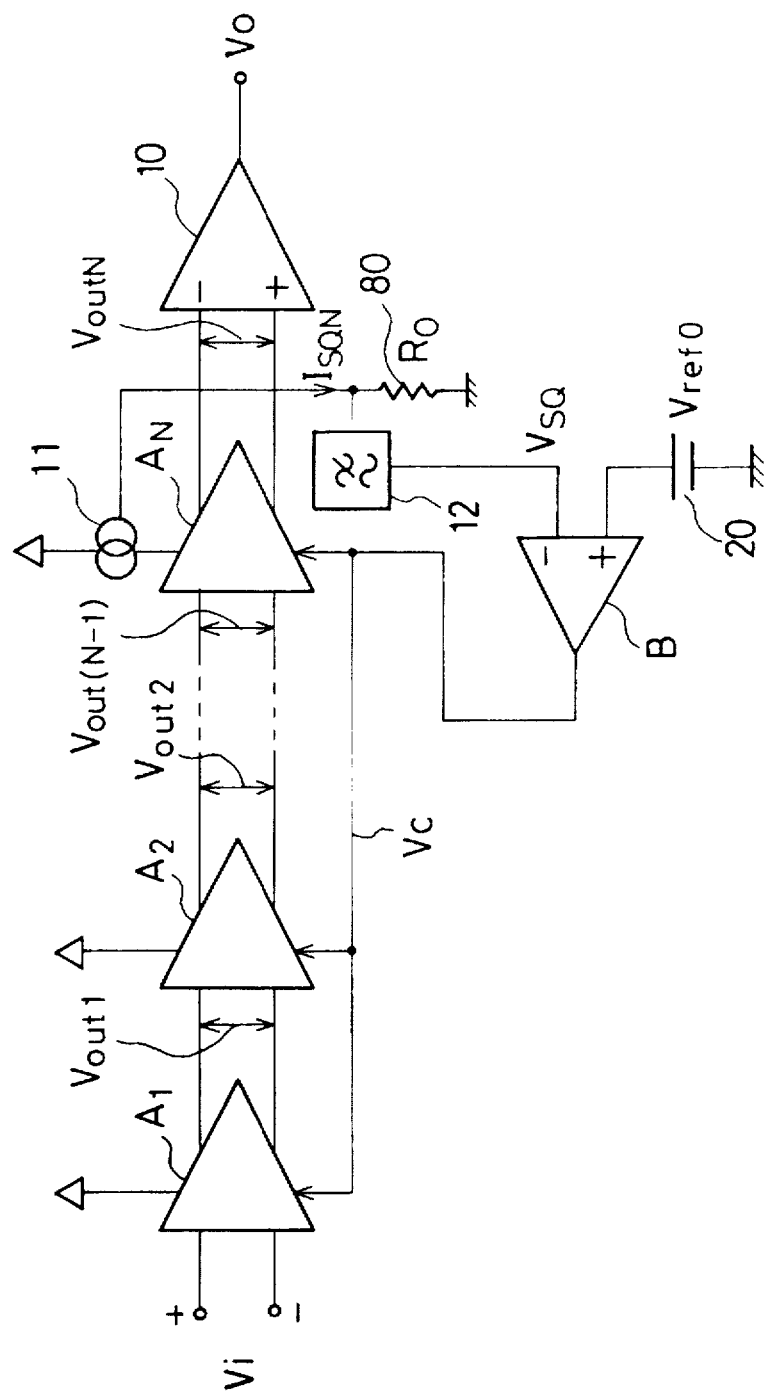
FIG. 11 is a circuit diagram of an AGC amplifier circuit according to a fourth embodiment of the present invention, which includes a plurality of triple-tail cells are cascade connected.

FIG. 11 shows an AGC amplifier circuit according to a fourth embodiment of the present invention.

As shown in FIG. 11, this AGC amplifier circuit has first to N-th AGC amplifier subcircuits $A_1$ to $A_N$ cascade connected, and an output amplifier 10 connected to the N-th subcircuit AN. The output voltage $V_o$ is taken out from the output amplifier 10. These structures are the same as those in the third embodiment.

Unlike the third embodiment, in FIG. 11, a rectified output current $I_{SQN}$ is outputted from the N-th subcircuit $A_N$ through a current output circuit 11. This current $I_{SQN}$ is converted to a voltage by a resistor 80 (resistance: $R_o$) to be applied to a low-pass filter (LPF) 12 which is provided in place of the capacitor. The filter 12 outputs a rectified voltage $V_{SQ}$ to an operational amplifier B. The amplifier B is applied with a reference voltage $V_{ref0}$, and outputs a common control voltage $V_c$ to the respective AGC amplifier subcircuits $A_1$ to $A_N$. Thus, a negative feedback loop is formed.

It is necessary for the fourth embodiment that the first to N-th AGC amplifier subcircuits $A_1$ to $A_N$ are matched in input/output phase with each other. This is a popular requirement for the conventional AGC amplifier circuits.

As described above, according to the present invention, a circuit itself containing a single triple-tail cell as shown in FIGS. 1 and 6 may be used as an AGC amplifier circuit, and a plurality of the circuits in FIG. 1 or 6 may be cascade-connected to constitute a multi-stage AGC amplifier circuit.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. An AGC amplifier circuit comprising:

a triple-tail cell including first, second, and third transistors whose emitters or sources are coupled together;

said first and second transistors forming a differential transistor-pair;

said first, second and third transistors being driven by a single tail current;

bases or gates of said first and second transistors forming input ends of said triple-tail cell to be applied with an input signal to be amplified;

collectors or drains of said first and second transistors forming output ends of said triple-tail cell from which an amplified output signal with a variable gain is derived;

a collector or drain of said third transistor forming an output end of said triple-tail cell from which a rectified output signal is derived;

a base or gate of said third transistor forming an input end of said triple-tail cell to be applied with a gain control signal; and means for producing said gain control signal, using said rectified output signal, and for negatively feeding back said gain control signal to said differential transistor-pair, thereby providing automatic gain control.

2. An AGC amplifier circuit as claimed in claim 1, further comprising an operational amplifier whose input ends are connected to said collectors or drains of said first and second transistors, respectively;

wherein said operational amplifier amplifies said amplified output signal to produce an output signal of said AGC amplifier circuit.

3. An AGC amplifier circuit as claimed in claim 1, wherein said means for producing said gain control signal further comprises an operational amplifier having an output end connected to said base or gate of said third transistor;

wherein input ends of said operational amplifier are applied with said rectified output signal and a reference signal;

and wherein said operational amplifier amplifies the difference between said rectified output signal and said reference signal to produce said gain control signal.

4. The AGC amplifier circuit of claim 3, wherein said means for producing said gain control signal and for negatively feeding back said gain control signal to said differential transistor-pair further comprises a current mirror circuit and a low pass filter.

5. The AGC amplifier circuit of claim 1 wherein emitter areas of said first and second transistors are equal and an emitter area of said third transistor is K times that of said first and second transistors, where K is an integer greater than or equal to 1.

6. An AGC amplifier circuit for amplifying an initial input signal comprising:

(a) first to n-th triple-tail cells cascade connected, where n is an integer equal to or greater than two;

said first triple-tail cell receiving said initial input signal and producing a first amplified output signal and a first rectified output signal;

said second to n-th triple-tail cells receiving said first to (n-1)-th amplified output signals and producing a second to n-th rectified output signals, respectively;

(b) each of said first to n-th triple-tail cells having a triple-tail cell comprising first, second and third transistors whose emitters or sources are coupled together;

said first, second and third transistors being driven by a single tail current;

said first and second transistors forming a differential transistor-pair;

bases or gates of said first and second transistors forming input ends of a corresponding one of said first to n-th triple-tail cells;

collectors or drains of said first and second transistors forming output ends of said corresponding one of said first to n-th triple-tail cells from which a corresponding one of said first to n-th amplified output signals with a variable gain is derived;

a collector or drain of said third transistor forming an output end of said corresponding one of said first to n-th triple-tail cells from which a corresponding one of said first to n-th rectified output signals is derived;

a base or gate of said third transistor forming an input end of said corresponding one of said first to n-th triple-tail cells to be applied with a corresponding one of said first to n-th gain control signals;

means for producing said first to n-th gain control signals using said corresponding ones of said first to n-th rectified output signals; and for negatively feeding back said first to n-th gain control signals to said differential transistor-pairs of said first to n-th triple-tail cells, respectively, thereby providing automatic gain control.

7. An AGC amplifier circuit as claimed in claim 6, wherein each of said first to n-th triple-tail cells further comprises an operational amplifier whose input ends are connected to said collectors or drains of said first and second transistors of a corresponding one of said first-to n-th triple-tail cells, respectively;

wherein said operational amplifier amplifies said corresponding one of said first to n-th amplified output signals to produce said corresponding one of said first to n-th amplified output signals.

8. An AGC amplifier circuit as claimed in claim 6, wherein said means for producing said gain signal in each of said first to n-th triple tail cells further comprises an operational amplifier having an output end connected to said base or gate of said third transistor of a corresponding one of said first to n-th triple-tail cells;

wherein input ends of said operational amplifier are applied with a corresponding one of said first to n-th rectified output signals and a corresponding one of said first to n-th reference signals;

and wherein said operational amplifier amplifies the difference between said corresponding one of said first to n-th rectified output signals and said corresponding one of said first to n-th reference signals to produce said gain control signal.

9. A The AGC amplifier circuit of claim 8 wherein said means for producing said gain control signal and for negatively feeding back said gain control signal to said differential transistor-pair in each of said first to n-th triple tail cells further comprises a current mirror circuit and a low pass filter.

10. The AGC amplifier circuit of claim 6 wherein emitter areas of said first and second transistors, in each of said first to n-th triple tail cells, are equal and an emitter area of said third transistor, in each of said first to n-th triple tail cells, is K times that of said first and second transistors, where K is an integer greater than or equal to 1.

11. An AGC amplifier circuit for amplifying an initial input signal comprising:

(a) first to n-th triple-tail cells cascade connected, where n is an integer equal to or greater than two;

said first triple-tail cell receiving said initial input signal and producing a first amplified output signal and a first rectified output signal;

said second to n-th triple-tail cells receiving said first to (n-1)-th amplified output signals and producing a second to n-th rectified output signals, respectively;

(b) each of said first to n-th triple-tail cells having a triple-tail cell including first, second and third transistors whose emitters or sources are coupled together;

said first, second and third transistors being driven by a single tail current;

said first and second transistors forming a differential transistor-pair;

bases or gates of said first and second transistors forming input ends of a corresponding one of said first to n-th triple-tail cells;

collectors or drains of said first and second transistors forming output ends of said corresponding one of said first to n-th triple-tail cells from which a corresponding one of said first to n-th amplified output signals with a variable gain is derived;

a collector or drain of said third transistor forming an output end of said corresponding one of said first to n-th triple-tail cells from which a corresponding one of said first to n-th rectified output signals is derived; a base or gate of said third transistor forming an input end of said corresponding one of said first to n-th triple-tail cells to be applied with a common gain control signal;

means for producing said common gain control signal using said n-th rectified output signal and for negatively feeding back said common gain control signal to said differential transistor-pairs of said first to n-th triple-tail cells, respectively, thereby providing automatic gain control.

12. An AGC amplifier circuit as claimed in claim 11, wherein each of said first to n-th triple-tail cells further comprises an operational amplifier whose input ends are connected to said collectors or drains of said first and second transistors of a corresponding one of said first to n-th triple-tail cells, respectively;

wherein said operational amplifier amplifies said corresponding one of said first to n-th amplified output signals to produce said corresponding one of said first to n-th amplified output signals.

13. An AGC amplifier circuit as claimed in claim 11, wherein said means for producing said common gain signal in each of said first to n-th triple tail cells further comprises an operational amplifier having an output end connected to said base or gate of said third transistor of a corresponding one of said first to n-th triple-tail cells;

wherein input ends of said operational amplifier are applied with a n-th rectified output signal from said n-th triple-tail cell and a common reference signal;

and wherein said operational amplifier amplifies the difference between said n-th rectified output signal and said common reference signal to produce said common gain control signal.

14. The AGC amplifier circuit of claim 13, wherein a rectified output current from said n-th triple-tail cell is converted to a voltage by a resistor then applied to a low pass filter which outputs said rectified n-th rectified output signal to said operational amplifier for producing said common gain signal.

15. The AGC amplifier circuit of claim 11 wherein emitter areas of said-first and second transistors, in each of said first to n-th triple tail cells, are equal and an emitter area of said third transistor, in each of said first to n-th triple tail cells, is K times that of said first and second transistors, where K is an integer greater than or equal to 1.

* * * * *

UNITED STATES PATENT AND TRADEMARK OFFICE
CERTIFICATE OF CORRECTION

PATENT NO.  : 5,748,041
DATED       : May 5, 1998
INVENTOR(S) : Kimura

It is certified that error(s) appears in the above-identified patent and that said Letters Patent is hereby corrected as shown below:

Column 4, line 35, after "equation (4)" insert -- $I_{C1} + I_{C2} + I_{C3} = \alpha_F I_o$ (4)--;

Column 6, line 63, after "equation (16)" delete "$I_{D2}°$" and insert --$I_{D2}$ + --;

Column 9, line 16, delete "$2\beta Io$" and insert --$2\beta I_o$--.

Signed and Sealed this

Sixth Day of October, 1998

*Attest:*

BRUCE LEHMAN

*Attesting Officer*         *Commissioner of Patents and Trademarks*